US011674666B2

(12) United States Patent
Iwakura

(10) Patent No.: US 11,674,666 B2
(45) Date of Patent: Jun. 13, 2023

(54) LIGHT-EMITTING MODULE AND PLANAR LIGHT SOURCE

(71) Applicant: NICHIA CORPORATION, Anan (JP)

(72) Inventor: Daisuke Iwakura, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/837,746

(22) Filed: Jun. 10, 2022

(65) Prior Publication Data

US 2022/0316682 A1 Oct. 6, 2022

Related U.S. Application Data

(63) Continuation of application No. 17/374,066, filed on Jul. 13, 2021, now Pat. No. 11,415,738.

(30) Foreign Application Priority Data

| Jul. 21, 2020 | (JP) | JP2020-124395 |
| Mar. 26, 2021 | (JP) | JP2021-052755 |
| Apr. 27, 2021 | (JP) | JP2021-075288 |

(51) Int. Cl.
*F21V 5/04* (2006.01)
*F21V 7/00* (2006.01)
(Continued)

(52) U.S. Cl.
CPC ............ *F21V 5/043* (2013.01); *F21V 7/0066* (2013.01); *G02B 6/0021* (2013.01);
(Continued)

(58) Field of Classification Search
CPC ............... G02B 6/0021; G02B 6/0055; G02F 1/133603
See application file for complete search history.

(56) References Cited

U.S. PATENT DOCUMENTS

2006/0071231 A1 4/2006 Han et al.
2011/0305003 A1 12/2011 Lee et al.
(Continued)

FOREIGN PATENT DOCUMENTS

| JP | 2004-101693 A | 4/2004 |
| JP | 2006-039494 A | 2/2006 |
(Continued)

OTHER PUBLICATIONS

Notice of Allowance on U.S. Appl. No. 17/374,066 dated Apr. 13, 2022 (12 pages).

*Primary Examiner* — Keith G. Delahoussaye
(74) *Attorney, Agent, or Firm* — Foley & Lardner LLP

(57) ABSTRACT

A light-emitting module includes: a light source; a light guide plate including an upper surface and a lower surface, the lower surface being at a side opposite to the upper surface, the light guide plate being configured to guide light from the light source; a wavelength conversion sheet located at an upper surface side of the light guide plate; a first light-reflective member located at a lower surface side of the light guide plate, the first light-reflective member including: a first resin member, and a first reflector, where a refractive index of the first reflector is lower than a refractive index of the first resin member; and a second light-reflective member located at a lower surface side of the first light-reflective member, wherein the second light-reflective member includes: a second resin member, and a second reflector, where a refractive index of the second reflector is higher than a refractive index of the second resin member.

19 Claims, 15 Drawing Sheets

(51) Int. Cl.
  *F21V 8/00* (2006.01)
  *H01L 33/58* (2010.01)
  *H01L 33/60* (2010.01)
  *H01L 33/62* (2010.01)
  *F21Y 105/16* (2016.01)
  *G02F 1/13357* (2006.01)

(52) U.S. Cl.
  CPC ......... *G02B 6/0051* (2013.01); *G02B 6/0055* (2013.01); *G02B 6/0065* (2013.01); *G02B 6/0083* (2013.01); *H01L 33/58* (2013.01); *H01L 33/60* (2013.01); *H01L 33/62* (2013.01); *F21V 2200/20* (2015.01); *F21Y 2105/16* (2016.08); *G02B 6/0031* (2013.01); *G02B 6/0068* (2013.01); *G02F 1/133605* (2013.01)

(56) References Cited

U.S. PATENT DOCUMENTS

| | | |
|---|---|---|
| 2013/0285090 A1 | 10/2013 | Furuyama et al. |
| 2016/0223741 A1 | 8/2016 | Lee |
| 2019/0094618 A1 | 3/2019 | Kyoukane et al. |
| 2019/0294004 A1 | 9/2019 | Hashimoto |
| 2020/0041845 A1 | 2/2020 | Yoshinaga et al. |
| 2020/0209458 A1 | 7/2020 | Yuu |
| 2020/0400998 A1 | 12/2020 | Lee et al. |

FOREIGN PATENT DOCUMENTS

| | | |
|---|---|---|
| JP | 2008-176305 A | 7/2008 |
| JP | 2010-122324 A | 6/2010 |
| JP | 2011-107538 A | 6/2011 |
| JP | 2011-211085 A | 10/2011 |
| JP | 2012-003263 A | 1/2012 |
| JP | 2012-229373 A | 11/2012 |
| JP | 2016-143669 A | 8/2016 |
| JP | 2019-061929 A | 4/2019 |
| JP | 2019-152836 A | 9/2019 |
| JP | 2020-107910 A | 7/2020 |
| JP | 2020-109745 A | 7/2020 |
| KR | 20100091502 A | 8/2010 |
| TW | 201344992 A | 11/2013 |
| TW | 202005112 A | 1/2020 |
| TW | 202020362 A | 6/2020 |
| WO | WO-2018/221657 A1 | 12/2018 |
| WO | WO-2020/092717 A1 | 5/2020 |

LIGHT-EMITTING MODULE AND PLANAR LIGHT SOURCE

CROSS-REFERENCE TO RELATED APPLICATIONS

This application is a continuation of U.S. patent application Ser. No. 17/374,066, filed on Jul. 13, 2021, which claims priority to Japanese Patent Application No. 2020-124395, filed on Jul. 21, 2020, Japanese Patent Application No. 2021-52755, filed on Mar. 26, 2021, and Japanese Patent Application No. 2021-075288, filed on Apr. 27, 2021, the disclosures of which are hereby incorporated by reference in their entireties.

BACKGROUND

The present disclosure relates to a light-emitting module and a planar light source.

Light-emitting modules that combine a light guide plate and a light-emitting element such as a light-emitting diode or the like are widely utilized in planar light sources such as, for example, backlights of liquid crystal displays, etc. For example, JP-A 2019-61929 (Kokai) discusses a backlight device that includes an LED substrate including a reflective sheet and multiple light-emitting diodes, and a diffuser plate that faces the LED substrate.

SUMMARY

The present disclosure is directed to a light-emitting module and a planar light source that can be thin and can have higher reflectance at a lower surface side of a light guide plate.

According to one embodiment, a light-emitting module includes: a light source; a light guide plate including an upper surface and a lower surface, the lower surface being at a side opposite to the upper surface, the light guide plate guiding light from the light source; a first light-reflective member located at the lower surface side of the light guide plate; and a second light-reflective member located at a lower surface side of the first light-reflective member. The first light-reflective member includes a first resin member, and a first reflector having a lower refractive index than the first resin member. The second light-reflective member includes a second resin member, and a second reflector having a higher refractive index than the second resin member.

According to certain embodiments of the preset disclosure, a light-emitting module and a planar light source can be thin and can have higher reflectance at a lower surface side of a light guide plate.

DETAILED DESCRIPTION

Figure 1:
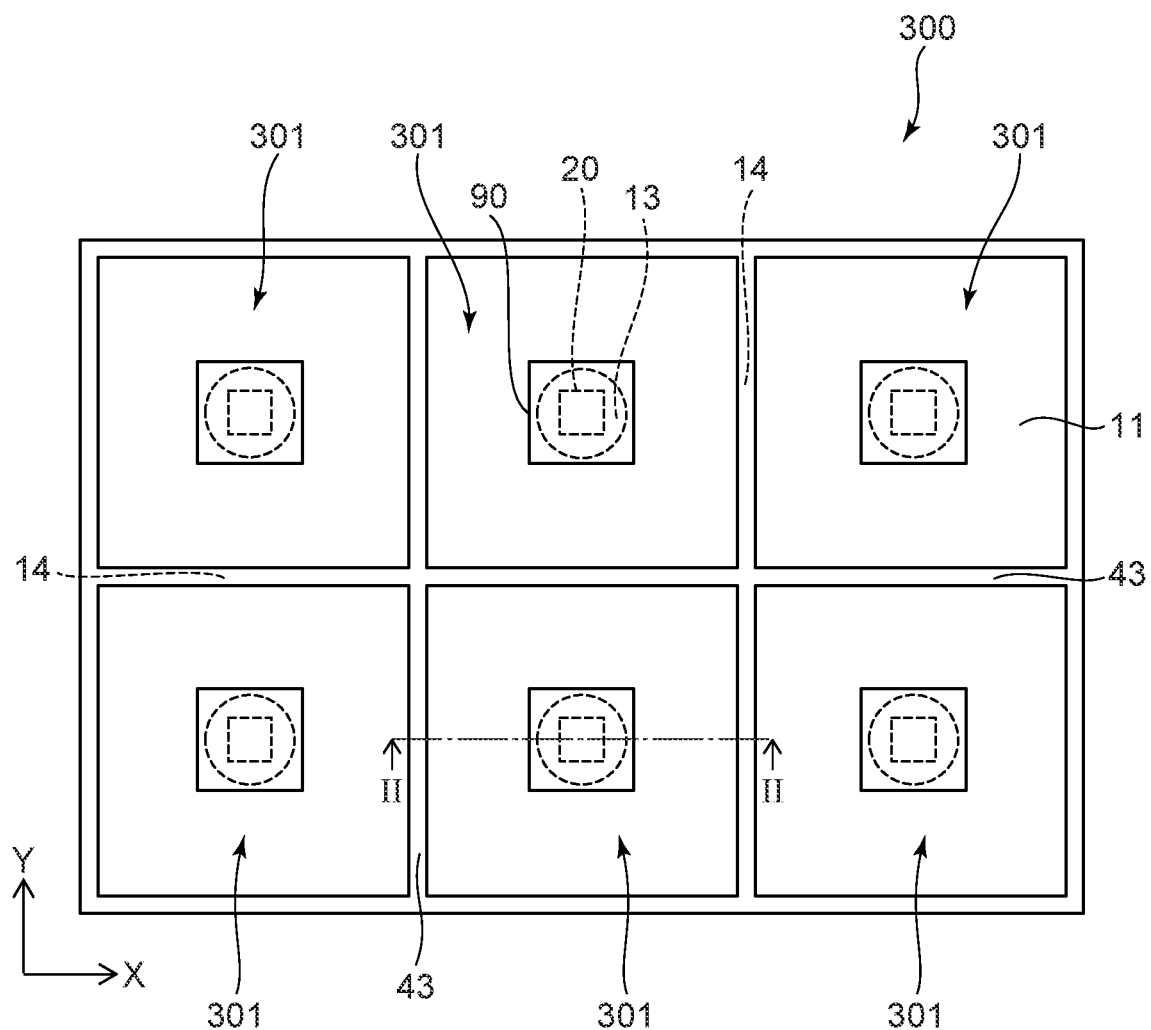
FIG. 1 is a schematic plan view of a planar light source of one embodiment of the invention.

Embodiments will now be described with reference to the drawings. The drawings schematically show embodiments. The scale, spacing, positional relationships, and the like of the members may be exaggerated. Portions of the members may be not-illustrated. End views that show only cutting surfaces may be used as cross-sectional views. The same elements in the drawings are marked with the same reference numerals.

FIG. 1 is a schematic plan view of a planar light source 300 of one embodiment of the invention. FIG. 1 illustrates the light-emitting surface of the planar light source 300 in a plan view. In FIG. 1, two mutually-orthogonal directions parallel to the light-emitting surface of the planar light source 300 are designated as an X-direction and a Y-direction. For example, the planar light source 300 has a rectangular exterior shape that includes two sides extending along the X-direction and two sides extending along the Y-direction.

The planar light source 300 can include one or multiple light sources 20. When the planar light source 300 includes multiple light sources 20, a partitioning groove 14 partitions between the light sources 20. One region that is partitioned by the partitioning groove 14 is taken as a light-emitting region 301. For example, one light-emitting region 301 can be used as the driving unit of local dimming. Multiple light sources 20 may be located in one light-emitting region 301 that is partitioned by the partitioning groove 14.

FIG. 1 illustrates the planar light source 300 that includes six light-emitting regions 301 partitioned into two rows and three columns. The number of the light-emitting regions 301 included in the planar light source 300 is not limited to the number shown in FIG. 1. The planar light source 300 may include one light source 20; in such a case, one planar light source 300 includes one light-emitting region 301. A planar light source device that has a larger surface area can be formed by arranging the multiple planar light sources 300.

Figure 2:
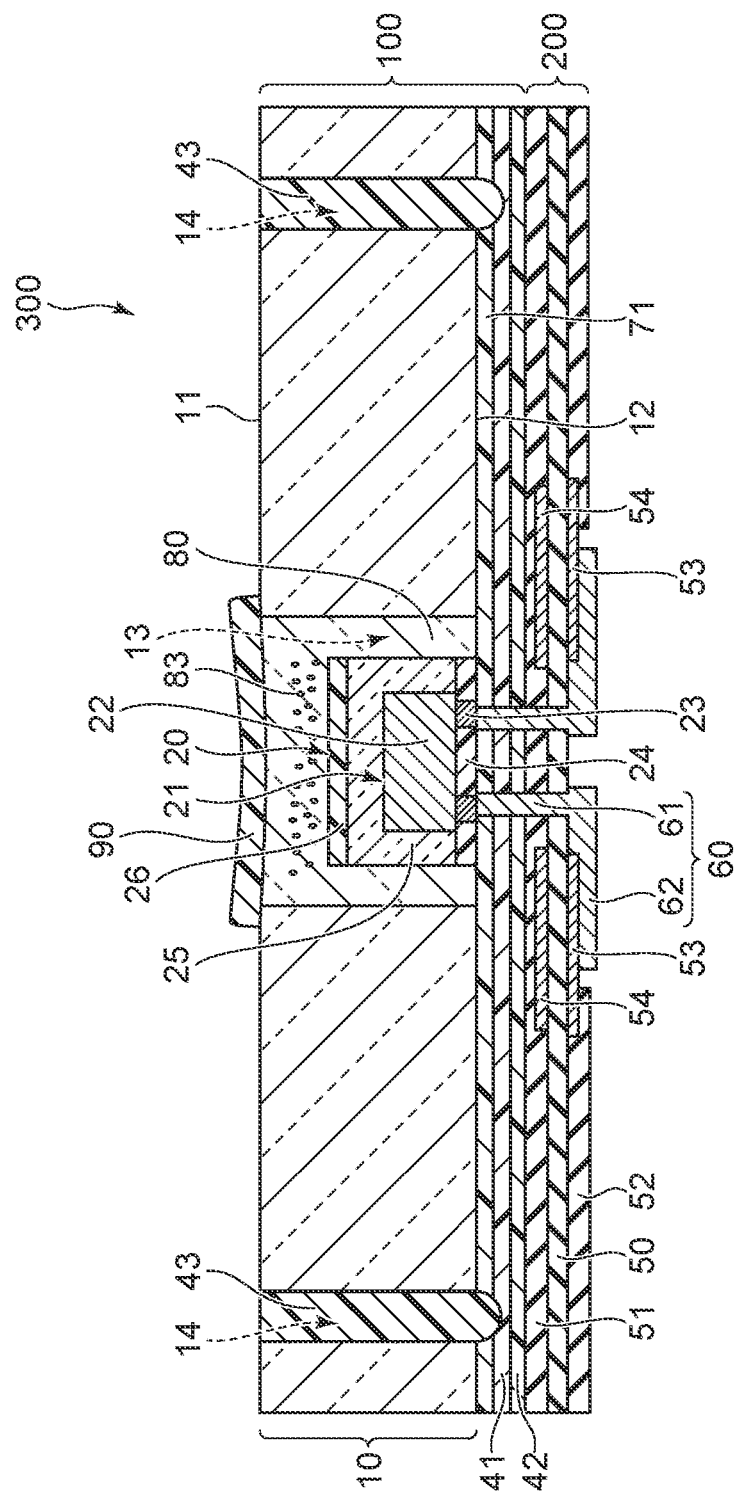
FIG. 2 is a schematic cross-sectional view along line II-II of FIG. 1.

FIG. 2 is a schematic cross-sectional view along line II-II of FIG. 1. The planar light source 300 includes a light-emitting module 100 and a wiring substrate 200.

The light-emitting module 100 includes a light guide plate 10, the light source 20, a first light-reflective member 41, a second light-reflective member 42, a third light-reflective member 43, a first light-transmitting member 80, and a first light-modulating member 90.

Light from the light source 20 is guided by the light guide plate 10; and the light guide plate 10 is transmissive to the light emitted by the light source 20. The light source 20 includes a light-emitting element 21. The light that is emitted by the light source 20 includes at least the light emitted by the light-emitting element 21. For example, when the light source 20 includes a phosphor, the light that is emitted by the light source 20 also includes the light emitted by the phosphor. It is favorable for the transmittance of the light guide plate 10 for the light from the light source 20 to be, for example, not less than 80%, and more favorably not less than 90%.

For example, a thermoplastic resin such as acrylic, polycarbonate, cyclic polyolefin, polyethylene terephthalate, polyester, or the like, a thermosetting resin such as epoxy, silicone, or the like, glass, etc., can be used as the material of the light guide plate 10.

The light guide plate 10 includes an upper surface 11 that is used as the light-emitting surface of the planar light source 300, and a lower surface 12 at the side opposite to the upper surface 11. The light guide plate 10 also includes a hole portion. In the example shown in FIG. 2, the hole portion is a through-hole 13 that extends from the upper surface 11 to the lower surface 12.

It is favorable for the thickness of the light guide plate 10 to be, for example, not less than 200 µm and not more than 800 µm. In the thickness direction, the light guide plate 10 may include a single layer, or a stacked body of multiple layers. When the light guide plate 10 includes a stacked body, transmissive bonding members may be provided between the layers. The layers of the stacked body may include different types of major materials. For example, a thermoplastic resin such as acrylic, polycarbonate, cyclic polyolefin, polyethylene terephthalate, polyester, or the like, a thermosetting resin such as epoxy, silicone, etc., can be used as the material of the bonding member.

As shown in FIG. 1, for example, the through-hole 13 can be circular in a plan view. Also, for example, the through-hole 13 can be an ellipse or a polygon such as a triangle, a rectangle, a hexagon, an octagon, etc., in a plan view.

The partitioning groove 14 that surrounds at least one light source 20 in a plan view is formed in the light guide plate 10. As shown in FIG. 1, it is favorable for the light guide plate 10 to include the partitioning groove 14 having a lattice configuration that includes the partitioning groove 14 extending in a straight line in the X-direction and the partitioning groove 14 extending in the Y-direction.

FIG. 2 illustrates the partitioning groove 14 that extends from the upper surface 11 to the lower surface 12 of the light guide plate 10 and reaches the first light-reflective member 41. The partitioning groove 14 may be a bottomed groove that is open at the upper surface 11 side of the light guide plate 10 and includes a bottom that does not reach the lower surface 12. In such a case, it is favorable for the bottom of the partitioning groove 14 to be proximate to the lower surface 12. Or, the partitioning groove 14 may be a bottomed groove that is open at the lower surface 12 side and includes a bottom that does not reach the upper surface 11.

The third light-reflective member 43 can be located in the partitioning groove 14. Although the third light-reflective member 43 is filled into the partitioning groove 14 so that the upper surface of the third light-reflective member 43 is a flat surface in FIG. 2, for example, the upper surface of the third light-reflective member 43 may be a concave or convex curved surface. The third light-reflective member 43 may cover at least a portion of the inner side surface of the partitioning groove 14 in a layer configuration; and a space may be formed in a portion of the interior of the partitioning groove 14. For example, a resin member that includes a light-diffusing agent can be used as such a third light-reflective member 43. For example, a $TiO_2$ particle is an example of the light-diffusing agent. Also, particles of $Nb_2O_5$, $BaTiO_3$, $Ta_2O_5$, $Zr_2O_3$, $ZnO$, $Y_2O_3$, $Al_2O_3$, $MgO$, $BaSO_4$, etc., are examples of the light-diffusing agent. For example, a metal member of Al, Ag, etc., may be used as the third light-reflective member 43. The entire interior of the partitioning groove 14 may be air.

To reduce uneven luminance, for example, the upper surface 11 of the light guide plate 10 may include a protrusion and/or a recess in a region of low luminance.

The third light-reflective member 43 suppresses light propagation between the adjacent light-emitting regions 301. For example, the light propagation from a light-emitting region 301 that is in a light-emitting state to a light-emitting region 301 that is in a non-light-emitting state is limited. Thereby, local dimming is possible in which each of the light-emitting regions 301 is a driving unit.

The first light-reflective member 41 is located at the lower surface 12 side of the light guide plate 10. For example, the first light-reflective member 41 is bonded to the lower surface 12 of the light guide plate 10 by a bonding member 71. For example, an epoxy resin, an acrylic resin, an olefin resin, etc., are examples of the bonding member 71.

The second light-reflective member 42 is located at the lower surface side of the first light-reflective member 41. For example, the second light-reflective member 42 is bonded to the lower surface of the first light-reflective member 41.

The first light-reflective member 41 faces the lower surface 12 of the light guide plate 10 and the lower surface of the light source 20 via the bonding member 71. In other words, the first light-reflective member 41 plugs the opening of the through-hole 13 of the light guide plate 10 at the lower surface 12 side. The second light-reflective member 42 faces the entire lower surface of the first light-reflective member 41. The second light-reflective member 42 may face a portion of the lower surface of the first light-reflective member 41. For example, it is favorable for the second light-reflective member 42 to be located at portions that are relatively distant from the light source 20 inside the light-emitting region 301 and therefore have a tendency for the luminance to be low (e.g., portions that correspond to the corners of the light-emitting region 301 in a plan view).

The first light-reflective member 41 and the second light-reflective member 42 are located between the wiring substrate 200 and the lower surface 12 of the light guide plate 10.

The thickness of the second light-reflective member 42 can be set to be less than the thickness of the first light-reflective member 41. For example, the thickness of the first light-reflective member 41 is not less than 20 µm and not more than 300 µm, and favorably not less than 40 µm and not more than 250 µm. The thickness of the second light-reflective member 42 is not less than 10 µm and not more than 150 µm, and favorably not less than 20 µm and not more than 100 µm.

Figure 3A:
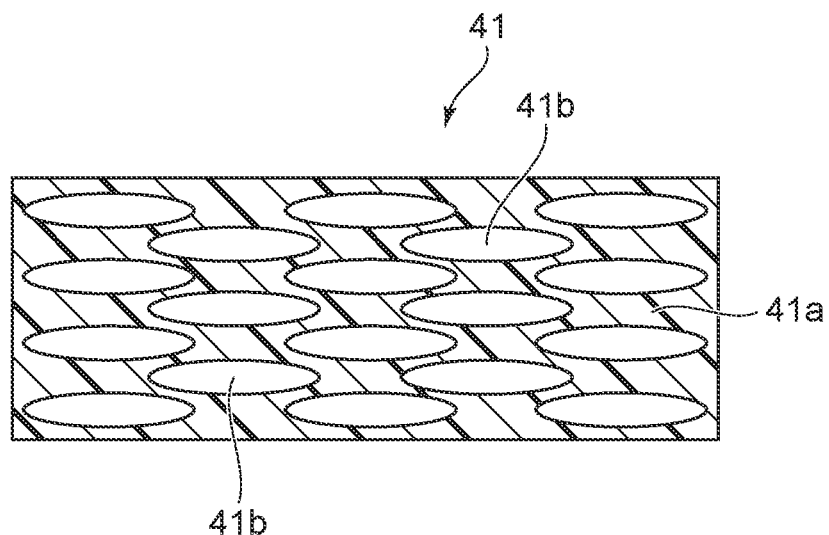
FIG. 3A is a schematic cross-sectional view of a first light-reflective member of one embodiment of the invention.

FIG. 3A is a schematic cross-sectional view of the first light-reflective member 41.

The first light-reflective member 41 includes a first resin member 41a, and a first reflector 41b that has a lower refractive index than the first resin member 41a. The first resin member 41a is transmissive to the light emitted by the light source 20 and is, for example, a resin member such as a polyethylene terephthalate (PET) resin, an olefin resin, an acrylic resin, a silicone resin, a urethane resin, an epoxy resin, etc. The first reflector 41b is, for example, a bubble. Also, for example, silica, hollow silica, $CaF_2$, $MgF_2$, etc., can be used as the first reflector 41b.

Figure 3B:
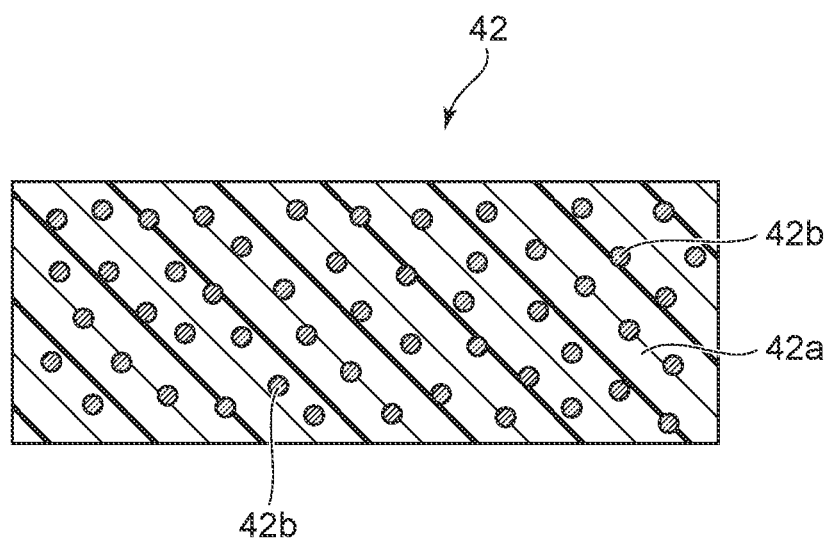
FIG. 3B is a schematic cross-sectional view of a second light-reflective member of one embodiment of the invention.

FIG. 3B is a schematic cross-sectional view of the second light-reflective member 42.

The second light-reflective member 42 includes a second resin member 42a, and a second reflector 42b that has a higher refractive index than the second resin member 42a. The second resin member 42a has a lower refractive index than the first resin member 41a of the first light-reflective member 41. The second resin member 42a is transmissive to the light emitted by the light source 20 and is, for example, a resin member such as an acrylic resin, a silicone resin, a urethane resin, an epoxy resin, a phenol resin, a BT resin, a polyimide resin, a unsaturated polyester resin, etc. The second reflector 42b is, for example, a $TiO_2$ particle. Also, for example, particles of $Nb_2O_5$, $BaTiO_3$, $Ta_2O_5$, $Zr_2O_3$, ZnO, $Y_2O_3$, $Al_2O_3$, MgO, $BaSO_4$, etc., can be used as the second reflector 42b.

It is favorable for the second light-reflective member 42 to have a small elastic modulus change for a temperature change of 25° C. to 100° C. For example, it is favorable for the change of the elastic modulus of the second light-reflective member 42 at 60° C. to be not more than 60% of the elastic modulus at 25° C., and for the change of the elastic modulus of the second light-reflective member 42 at 100° C. to be not more than 80% of the elastic modulus at 25° C. In particular, it is favorable for the elastic modulus of the second light-reflective member 42 at 100° C. to be not less than 10000 Pa and not more than 50000 Pa, and more favorably not less than 20000 Pa and not more than 40000 Pa. Thereby, for example, deviation of the position of the second light-reflective member 42 with respect to the first light-reflective member 41 due to the heat when curing a conductive paste located inside a hole 401 such as that shown in FIG. 12 can be suppressed; and the occurrence of cracks in the cured conductive paste (a first conductive portion 61) can be suppressed.

For example, the refractive index of the first resin member 41a, the first reflector 41b, the second resin member 42a, or the second reflector 42b according to the embodiment can be measured using an Abbe refractometer or the like or estimated from the composition identified by Fourier transform infrared spectroscopy analysis, etc. Also, for example, the refractive index of the first resin member 41a or the second resin member 42a can be estimated by disposing the first resin member 41a or the second resin member 42a inside a liquid having a designated refractive index (hereinbelow, called a refractive liquid) and by using an optical microscope to observe the existence or absence of an interface between the refractive liquid and the first resin member 41a or the second resin member 42a. In other words, the refractive index of the first resin member 41a or the second resin member 42a can be estimated to be near the refractive index of the refractive liquid when an interface with the refractive liquid cannot be seen (or is difficult to see). When the first resin member 41a, the first reflector 41b, the second resin member 42a, or the second reflector 42b is a commercial product, the catalog value of the refractive index can be used.

The light source 20 is located inside the through-hole 13 of the light guide plate 10 on the first light-reflective member 41 with the bonding member 71 interposed.

Figure 4A:
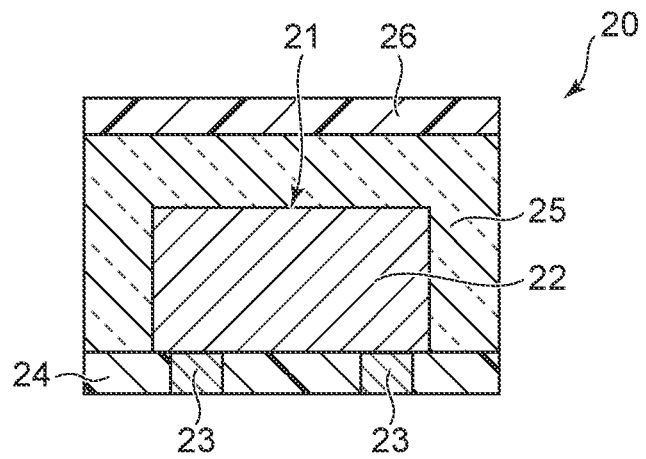
FIG. 4A is a schematic cross-sectional view of a light source of one embodiment of the invention.

FIG. 4A is a schematic cross-sectional view of an example of the light source 20.

The light source 20 may be a solitary light-emitting element or may have a structure in which an optical member such as a wavelength conversion member or the like is combined with a light-emitting element. According to the embodiment as shown in FIG. 4A, the light source 20 includes the light-emitting element 21, an electrode 23, a cover member 24, a second light-transmitting member 25, and a second light-modulating member 26. The light source 20 does not necessarily include the second light-modulating member 26 according to the desired light distribution. For example, the second light-modulating member 26 is not necessarily located on the second light-transmitting member 25; in other words, the upper surface of the second light-transmitting member 25 can form a portion of the upper surface of the light source 20.

The light-emitting element 21 includes a semiconductor stacked body 22. The semiconductor stacked body 22 includes, for example, a support substrate of sapphire, gallium nitride, or the like, an n-type semiconductor layer and a p-type semiconductor layer that are located on the support substrate, a light-emitting layer that is sandwiched between the n-type semiconductor layer and the p-type semiconductor layer, and an n-side electrode and a p-side electrode that are electrically connected respectively to the n-type semiconductor layer and the p-type semiconductor layer. The support substrate may be removed when the semiconductor stacked body 22 is used. The light-emitting layer may have a structure that includes a single active layer such as a single quantum well structure (SQW) or a double heterostructure, or a structure that includes an active layer group such as a multi-quantum well structure (MQW). The light-emitting layer is configured to emit visible light or ultraviolet light. The light-emitting layer is configured to emit visible light from blue to red. The semiconductor stacked body 22 that includes such a light-emitting layer can include, for example, $In_xAl_yGa_{1-x-y}N$ (0≤x, 0≤y, and x+y≤1). The semiconductor stacked body 22 can include at least one light-emitting layer described above that can emit light. For example, the semiconductor stacked body 22 may have a structure that includes not less than one light-emitting layer between an n-type semiconductor layer and a p-type semiconductor layer, or a configuration in which a structure that includes an n-type semiconductor layer, a light-emitting layer, and a p-type semiconductor layer in this order are repeated multiple times. When the semiconductor stacked body 22 includes multiple light-emitting layers, the light-emitting layers may have different light emission peak wavelengths for the same light emission peak wavelength. The light emission peak wavelengths being the same means that the fluctuation may be about several nm. A combination of the light emission peak wavelengths can be selected as appropriate. For example, when the semiconductor stacked body 22 includes two light-emitting layers, a light-emitting layer that includes a combination of blue light and blue light, green light and green light, red light and red light, ultraviolet light and ultraviolet light, blue light and green light, blue light and red light, green light and red light, etc., can be selected. Each light-emitting layer may include multiple active layers having different light emission peak wavelengths or the same light emission peak wavelength.

The second light-transmitting member 25 covers the upper surface and side surface of the light-emitting element 21. The second light-transmitting member 25 has the functions of protecting the light-emitting element 21, performing wavelength conversion and light diffusion according to particles added to the second light-transmitting member 25, etc. Specifically, the second light-transmitting member 25 may include a light-transmitting resin and may further include a phosphor. For example, a silicone resin, an epoxy resin, etc., can be used as the light-transmitting resin. An yttrium-aluminum-garnet-based phosphor (e.g., $Y_3(Al, Ga)_5O_{12}$:Ce), a lutetium-aluminum-garnet-based phosphor (e.g., $Lu_3(Al, Ga)_5O_{12}$:Ce), a terbium-aluminum-garnet-based phosphor (e.g., $Tb_3(Al, Ga)_5O_{12}$:Ce), a CCA-based phosphor (e.g., $Ca_{10}(PO_4)_6C_{12}$:Eu), an SAE-based phosphor (e.g., $Sr_4Al_{14}O_{25}$:Eu), a chlorosilicate-based phosphor (e.g., Ca$_8$MgSi$_4$O$_{16}$C$_{12}$:Eu), a nitride-based phosphor such as a β-sialon-based phosphor (e.g., (Si, A$_1$)$_3$(O, N)$_4$:Eu), an α-sialon-based phosphor (e.g., M$_z$(Si, Al)$_{12}$(O, N)$_{16}$:Eu (however, 0<z≤2, and M is a lanthanide element other than Li, Mg, Ca, Y, La, and Ce)), an SLA-based phosphor (e.g., SrLiAl$_3$N$_4$:Eu), a CASN-based phosphor (e.g., CaAlSiN$_3$:Eu), a SCASN-based phosphor (e.g., (Sr, Ca)AlSiN$_3$:Eu), or the like, a fluoride-based phosphor such as a KSF-based phosphor (e.g., K$_2$SiF$_6$:Mn), a KSAF-based phosphor (e.g., K$_2$(Si, Al)F$_6$:Mn), a MGF-based phosphor (e.g., 3.5MgO.0.5MgF$_2$.GeO$_2$:Mn), or the like, a phosphor that has a perovskite structure (e.g., CsPb(F, Cl, Br, I)$_3$), a quantum dot phosphor (e.g., CdSe, InP, AgInS$_2$, or AgInSe$_2$), etc., can be used as the phosphor. One type of phosphor or multiple types of phosphors may be used as the phosphor added to the second light-transmitting member 25.

The KSAF-based phosphor may include a composition represented by the following formula (I).

$$M_2[Si_pAl_qMn_rF_s] \tag{I}$$

In formula (I), M represents an alkali metal and may contain at least K. Mn may be a tetravalent Mn ion. The parameter of p, q, r and s may satisfy the relationship of "0.9≤p+q+r≤1.1, 0<q≤0.1, 0<r≤0.2, 5.9≤s≤6.1". Preferably, the parameter of p, q, r and s may satisfy the relationship of "0.95≤p+q+r≤1.05 or 0.97≤p+q+r≤1.03, 0<q≤0.03, 0.002≤q≤0.02 or 0.003≤q≤0.015, 0.005≤r≤0.15, 0.01≤r≤0.12 or 0.015≤r≤0.1, 5.92≤s≤6.05 or 5.95≤s≤6.025". For example, the composition represented by K$_2$[Si$_{0.946}$Al$_{0.005}$Mn$_{0.049}$F$_{5.995}$], K$_2$[Si$_{0.942}$Al$_{0.008}$Mn$_{0.050}$F$_{5.992}$], and K$_2$[Si$_{0.939}$Al$_{0.014}$Mn$_{0.047}$F$_{5.986}$] can be exemplified. According to such a KSAF-based phosphor, it is possible to obtain red emission having high brightness and a narrow half-value width of the emission peak wavelength.

The cover member 24 is located at least at the lower surface of the light-emitting element 21. The cover member 24 is disposed so that the surface (in FIG. 4A, the lower surface) of the electrode 23 that is electrically connected with the light-emitting element 21 is not covered with the cover member 24. The cover member 24 is located also at the lower surface of the second light-transmitting member 25 that covers the side surface of the light-emitting element 21.

The cover member 24 is reflective to the light emitted by the light source 20. The cover member 24 is, for example, a resin member that includes a light-diffusing agent. Specifically, the cover member 24 is a silicone resin, an epoxy resin, or an acrylic resin that includes a light-diffusing agent made of particles of TiO$_2$, SiO$_2$, Al$_2$O$_3$, ZnO, glass, etc. The cover member 24 may be an inorganic member.

The second light-modulating member 26 is located at the upper surface of the second light-transmitting member 25 and controls the amount and/or emission direction of the light emitted from the upper surface of the second light-transmitting member 25. The second light-modulating member 26 is reflective and transmissive to the light emitted by the light source 20. A portion of the light that is emitted from the upper surface of the second light-transmitting member 25 is reflected by the second light-modulating member 26, and another portion passes through the second light-modulating member 26. It is favorable for the transmittance of the second light-modulating member 26 to be, for example, not less than 1% and not more than 50%, and more favorably not less than 3% and not more than 30%. The luminance directly above the light source 20 is reduced thereby, and the surface fluctuation of the luminance of the planar light source 300 is reduced. The second light-modulating member 26 can include a light-transmitting resin, a light-diffusing agent that is included in the light-transmitting resin, etc. The light-transmitting resin is, for example, a silicone resin, an epoxy resin, or an acrylic resin. For example, particles of TiO$_2$, SiO$_2$, Al$_2$O$_3$, ZnO, glass, etc., are examples of the light-diffusing agent. The second light-modulating member 26 may be, for example, a metal member of Al, Ag, or the like, or a dielectric multilayer film. The second light-modulating member 26 may be an inorganic member.

A sheet-like wavelength conversion member (hereinbelow, called a wavelength conversion sheet) that includes the phosphor described above may be located on the planar light source 300. A planar light source that emits white light can be obtained by the wavelength conversion sheet absorbing a portion of the blue light from the light source 20 and emitting yellow light, green light, and/or red light. For example, white light can be obtained by combining a light source that can emit blue light and a wavelength conversion sheet that includes a phosphor that can emit yellow light. Or, a light source that can emit blue light and a wavelength conversion sheet that includes a red phosphor and a green phosphor may be combined. Or, a light source that can emit blue light and multiple wavelength conversion sheets may be combined. For example, a wavelength conversion sheet that includes a phosphor that can emit red light and a wavelength conversion sheet that includes a phosphor that can emit green light can be selected as the multiple wavelength conversion sheets. Or, a light source that includes a light-emitting element adapted to emit blue light, a light-transmitting member including a phosphor adapted to emit red light, and a wavelength conversion sheet including a phosphor adapted to emit green light may be combined.

As shown in FIG. 2, the first light-transmitting member 80 is located in the through-hole 13 of the light guide plate 10. The first light-transmitting member 80 is transmissive to the light emitted by the light source 20; for example, the same resin as the material of the light guide plate 10 or a resin that has a slightly smaller refractive index than the material of the light guide plate 10 can be used.

The first light-transmitting member 80 is located between the side surface of the light source 20 and the side surface of the through-hole 13. In such a case, it is favorable for the first light-transmitting member 80 to be located so that a space such as an air layer or the like is not formed between the first light-transmitting member 80 and the side surface of the light source 20 and between the first light-transmitting member 80 and the side surface of the through-hole 13. Thereby, the light from the light source 20 can be easily guided into the light guide plate 10.

The first light-transmitting member 80 covers the upper surface of the light source 20 (in the example, the upper surface of the second light-modulating member 26). The upper surface of the first light-transmitting member 80 can be a flat surface. Or, the upper surface of the first light-transmitting member 80 can be a concave or convex curved surface.

The wiring substrate 200 includes an insulating base 50, a first wiring layer 53 that is located at one surface of the insulating base 50, a second wiring layer 54 that is located at another surface of the insulating base 50, and a conductive member 60.

The wiring substrate 200 can further include a first insulating layer 52 and a second insulating layer 51. The first insulating layer 52 covers a portion of the first wiring layer 53 and a portion of the surface of the insulating base 50 at which the first wiring layer 53 is located. The second insulating layer 51 covers the second wiring layer 54 and the surface of the insulating base 50 at which the second wiring layer 54 is located. The second light-reflective member 42 is located on the second insulating layer 51.

The conductive member 60 includes the first conductive portion 61 and a second conductive portion 62. The first conductive portion 61 extends through the bonding member 71, the first light-reflective member 41, the second light-reflective member 42, the second insulating layer 51, and the insulating base 50. The first conductive portion 61 is connected with the electrode 23 and is positioned under the electrode 23 of the light source 20 in the thickness direction of the planar light source 300.

The second conductive portion 62 covers a portion of the first wiring layer 53 and is located at a surface of the insulating base 50 that is not covered with the first insulating layer 52. The second conductive portion 62 connects the first conductive portion 61 and the first wiring layer 53. Accordingly, the electrode 23 of the light source 20 is electrically connected with the first wiring layer 53 via the first and second conductive portions 61 and 62 of the conductive member 60.

The first wiring layer 53 and the second wiring layer 54 are electrically connected to each other at a portion of the planar light source 300 other than the cross-sectional portion shown in FIG. 2. For example, the first wiring layer 53 and the second wiring layer 54 are connected by an interconnect extending through the insulating base 50.

The insulating base 50, the first insulating layer 52, and the second insulating layer 51 can include, for example, a resin such as polyimide, polyethylene naphthalate, polyethylene terephthalate, etc. The first wiring layer 53 and the second wiring layer 54 can include, for example, a metal such as copper, aluminum, etc. The conductive member 60 is, for example, a conductive paste in which a conductive filler is dispersed in a binder resin. The conductive member 60 can include, for example, a metal such as copper, silver, etc., as the filler. The filler is particulate or flake-like.

The first light-modulating member 90 is located at least on the first light-transmitting member 80. The first light-modulating member 90 is reflective and transmissive to the light emitted by the light source 20. The first light-modulating member 90 can include a light-transmitting resin, a light-diffusing agent that is dispersed in the light-transmitting resin, etc. The light-transmitting resin is, for example, a silicone resin, an epoxy resin, or an acrylic resin. For example, particles of $TiO_2$, $SiO_2$, $Al_2O_3$, ZnO, glass, etc., are examples of the light-diffusing agent. The first light-modulating member 90 may be an inorganic member. The first light-modulating member 90 can cover the entirety or a portion of the upper surface of the first light-transmitting member 80.

As shown in FIG. 1, the first light-modulating member 90 overlaps the light source 20 in a plan view. In the example shown in FIG. 1, the first light-modulating member 90 is a larger rectangle than the rectangular light source 20 in a plan view. The first light-modulating member 90 can be a shape such as a circle, a triangle, a hexagon, an octagon, etc., in a plan view. As shown in FIG. 2, the first light-modulating member 90 may extend onto the upper surface of the first light-transmitting member 80 and the upper surface 11 of the light guide plate 10 at the periphery of the upper surface of the first light-transmitting member 80.

In addition to overlapping the light source 20 in a plan view, the first light-modulating member 90 also may be interspersed in regions of high luminance of the upper surface 11 of the light guide plate 10 to decrease uneven luminance. For example, the first light-modulating member 90 can be interspersed at the vicinity of the partitioning groove 14, and more specifically, along the partitioning groove 14.

A portion of the first light-transmitting member 80 is located between the first light-modulating member 90 and the second light-modulating member 26 of the light source 20. The first light-transmitting member 80 has a higher transmittance for the light emitted by the light source 20 than the second and first light-modulating members 26 and 90. The transmittance of the first light-transmitting member 80 for the light emitted by the light source 20 can be in a range that is not more than 100%, and is not less than 2 times and not more than 100 times the transmittance of the second light-modulating member 26 and the transmittance of the first light-modulating member 90.

The second light-modulating member 26 reflects a portion of the light that is emitted directly upward from the light source 20 and passes through another portion. Thereby, the luminance of the region directly above the light source 20 can be prevented from becoming extremely high compared to the luminance of the other regions in light-emitting regions 301 of the planar light source 300. That is, the uneven luminance of the light emitted from one light-emitting region 301 partitioned by the partitioning groove 14 can be reduced. It is favorable for the thickness of the first light-modulating member 90 to be not less than 0.005 mm and not more than 0.2 mm, and more favorably not less than 0.01 mm and not more than 0.075 mm. It is favorable for the reflectance of the first light-modulating member 90 to be set to be less than the reflectance of the second light-modulating member 26 of the light source 20; for example, it is favorable to be not less than 20% and not more than 90% for the light from the light source 20, and more favorably not less than 30% and not more than 85%.

In the example shown in FIG. 2, a portion of the first light-transmitting member 80 that has a higher transmittance than the second and first light-modulating members 26 and 90 is interposed between the second light-modulating member 26 and the first light-modulating member 90. The light that is emitted from the light source 20, the light that is reflected by the first light-reflective member 41 at the periphery of the light source 20, etc., are guided into the first light-transmitting member 80 between the second light-modulating member 26 and the first light-modulating member 90. Thereby, the region directly above the light source 20 can be not too bright and not too dark; as a result, the uneven luminance in the light-emitting surface of the light-emitting region 301 can be reduced.

The first light-reflective member 41 increases the luminance of the light that is extracted from the upper surface 11 that is located at the lower surface 12 side of the light guide plate 10 because the light that is guided through the light guide plate 10 toward the lower surface 12 side is reflected by the first light-reflective member 41 toward the upper surface 11 side that is the light-emitting surface of the planar light source 300.

In the region between the first light-reflective member 41 and the upper surface 11, the light from the light source 20 is guided through the light guide plate 10 toward the partitioning groove 14 while repeating total internal reflection at the first light-reflective member 41 and the upper surface 11. A portion of the light traveling toward the upper surface 11 is extracted outside the light guide plate 10 from the upper surface 11.

As described above with reference to FIG. 3A, the first light-reflective member 41 includes the transmissive first resin member 41*a*, and the first reflector 41*b* that has a lower refractive index than the first resin member 41*a*. Accordingly, the light that enters the first resin member 41*a* easily undergoes total internal reflection at the interface between the first resin member 41*a* and the first reflector 41*b*. The light can be easily guided to regions distant from the light source 20 by utilizing the total internal reflection of such a first light-reflective member 41. The light is easily guided to the entire region of the light-emitting region 301 even when the distance between the light source 20 and the end portion (the partitioning groove 14) of each light-emitting region 301 is long. The uneven luminance inside the light-emitting surface (the upper surface 11) can be reduced thereby. Also, the number of the light sources 20 provided in the light guide plate 10 may be reduced.

It is favorable for the refractive index difference between the first resin member 41*a* and the first reflector 41*b* to be large; in particular, it is favorable for the first reflector 41*b* to be a bubble (air).

The effect of suppressing the light that passes through the first light-reflective member 41 and escapes downward from the light-emitting module 100 increases as the thickness of the first light-reflective member 41 increases. The light that escapes downward from the light-emitting module 100 is not extracted from the upper surface 11 and is lost. However, making the first light-reflective member 41 thicker impedes thinning of the light-emitting module 100.

Therefore, according to the embodiment, the second light-reflective member 42 is located at the lower surface side of the first light-reflective member 41. As described above with reference to FIG. 3B, the second light-reflective member 42 includes the transmissive second resin member 42*a*, and the second reflector 42*b* that has a higher refractive index than the second resin member 42*a*. The light that enters the second resin member 42*a* can be reflected and scattered by the second reflector 42*b*; and the escape of light downward from the light-emitting module 100 can be suppressed. In other words, by combining the first light-reflective member 41 and the second light-reflective member 42 that has different reflective characteristics, the escape of the light downward from the light-emitting module 100 can be suppressed while ensuring the light-guiding ability inside the light guide plate 10, and the light extraction efficiency from the upper surface 11 can be increased.

Also, degradation of the wiring substrate 200 can be suppressed by suppressing the light that escapes downward from the light-emitting module 100.

It is favorable for the refractive index difference between the second resin member 42*a* and the second reflector 42*b* to be large; in particular, titanium oxide is favorable as the second reflector 42*b*.

It is favorable for the refractive index of the second resin member 42*a* of the second light-reflective member 42 to be less than the refractive index of the first resin member 41*a* of the first light-reflective member 41. Thereby, when light is incident on the second resin member 42*a* from the first resin member 41*a*, the light easily undergoes total internal reflection at the interface between the first resin member 41*a* and the second resin member 42*a*; and the light that escapes downward from the light-emitting module 100 can be further suppressed. Also, when the refractive index of the second resin member 42*a* is low, the refractive index difference between the second resin member 42*a* and the second reflector 42*b* that has a higher refractive index than the second resin member 42*a* is large, and scattering reflections occur more easily.

The guidance of the light inside the light guide plate 10 is mainly performed by the first light-reflective member 41, and it is sufficient for the second light-reflective member 42 to suppress the downward escape of the light; therefore, the thickness of the second light-reflective member 42 may be less than the thickness of the first light-reflective member 41.

Figure 16:
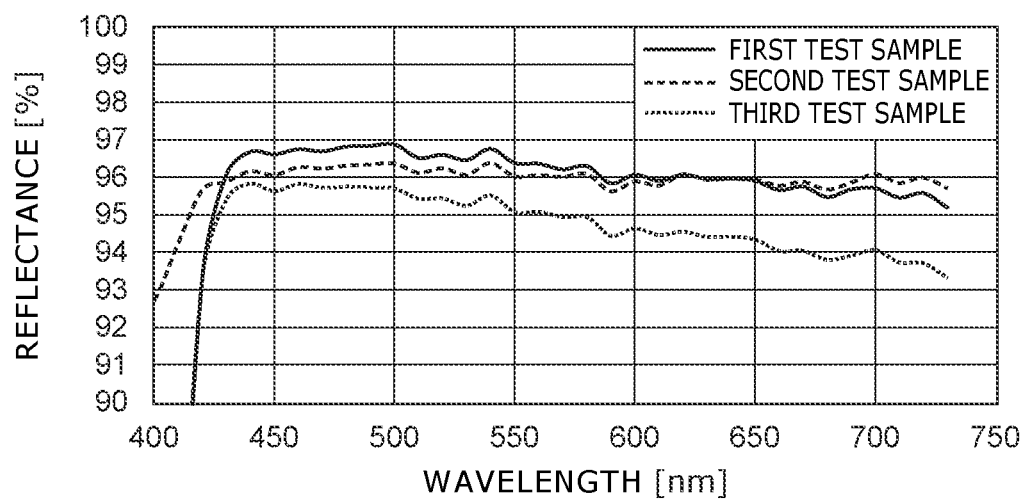
FIG. 16 is a graph illustrating measurement results of the reflectance by wavelength for three test samples.

FIG. 16 is a graph illustrating measurement results of the reflectance by wavelength for three test samples.

The solid line illustrates the measurement result of a first test sample. The first test sample had a structure in which a PET resin layer including bubbles was stacked with an acrylic resin layer including $TiO_2$ particles interposed on a glass substrate. The first test sample was a stacked body of three layers, i.e., the glass substrate, the acrylic resin layer including $TiO_2$ particles, and the PET resin layer including bubbles. The PET resin layer including bubbles corresponds to the first light-reflective member according to the embodiment; and the acrylic resin layer including $TiO_2$ particles corresponds to the second light-reflective member according to the embodiment. The thickness of the PET resin layer including bubbles was 50 μm; and the thickness of the acrylic resin layer including $TiO_2$ particles was 40 μm.

The broken line illustrates the measurement result of a second test sample. The second test sample had a structure in which a PET resin layer including bubbles was stacked with an acrylic resin layer not including a light-diffusing agent such as a $TiO_2$ particle interposed on a glass substrate. The second test sample was a stacked body of three layers, i.e., the glass substrate, the acrylic resin layer not including a light-diffusing agent, and the PET resin layer including bubbles. The thickness of the PET resin layer including bubbles in the second test sample was 188 μm and was greater than the thickness of the PET resin layer including bubbles in the first test sample. The thickness of the acrylic resin layer not including a light-diffusing agent in the second test sample was 25 μm.

The dotted line illustrates the measurement result of a third test sample. The third test sample was a stacked body of the same three layers as the second test sample; only the thickness of the PET resin layer including bubbles was different from that of the second test sample. The thickness of the PET resin layer including bubbles in the third test sample was equal to the thickness of the PET resin layer including bubbles in the first test sample, i.e., 50 μm.

The total thickness of the two layers on the glass substrate in the first test sample was less than the total thickness of the two layers on the glass substrate in the second test sample. The total thickness of the two layers on the glass substrate in the first test sample was less than the thickness of the one layer of the PET resin layer including bubbles in the second test sample. The thickness of the glass substrate was the same between the first, second, and third test samples. The reflectances of the first, second, and third test samples were measured for multiple wavelengths from the bubble-including PET resin layer side by using a high-speed spectrophotometer CMS-35SP of Murakami Color Research Laboratory Co., Ltd.

From the measurement result of FIG. 16, for the first test sample that corresponds to a configuration according to the embodiment, even though the thickness of the PET resin layer including bubbles was less than that of the second test sample, the acrylic resin layer including $TiO_2$ particles was formed under the PET resin layer including bubbles; therefore, the reflectance was equal to or greater than that of the second test sample in a wavelength band not less than about 430 nm and not more than about 650 nm.

For the third test sample, the reflectance decreases toward the longer-wavelength side of the light; for the first test sample, the decrease of the reflectance was low even at the longer-wavelength side.

For example, to obtain a light source that can emit white light by combining a red phosphor, a yellow phosphor, and a light-emitting element that can emit blue light, the reflected yellow light and red light of the first test sample can be greater than those of the third test sample. Therefore, the same white light as the third test sample can be obtained by the first test sample with a lower phosphor amount than the third test sample; therefore, the phosphor cost can be reduced. The reflected green light of the first test sample can be greater than that of the third test sample when the light source includes one light-emitting element that includes a light-emitting layer that can emit, for example, blue light and a light-emitting layer that can emit, for example, green light of a longer wavelength than the blue light. Therefore, in the first test sample, the green light amount can be prevented from being low with respect to the blue light; therefore, uneven color when used in a planar light source can be reduced.

In FIG. 1, when the X-direction is taken to be the row direction and the Y-direction is taken to be the column direction, the planar light source 300 shown in FIG. 1 includes six light-emitting regions 301 partitioned into two rows and three columns. The luminance was measured and compared for a planar light source that included twenty-five light-emitting regions partitioned into five rows and five columns prototyped with the conditions of the first test sample described above and a planar light source that included twenty-five light-emitting regions similarly partitioned into five rows and five columns prototyped with the conditions of the third test sample described above. As a result, the luminance of the planar light source prototyped with the conditions of the first test sample was about 7.7% greater than the luminance of the planar light source prototyped with the conditions of the third test sample. From the reflectance measurement results shown in FIG. 16, it can be seen that the reflectance difference between the first test sample and the third test sample was about 1 to 2%; however, this reflectance difference has a greater effect on the luminance difference when used in a planar light source.

According to the embodiment, the reflectance of the lower surface 12 side of the light guide plate 10 can be improved while thinning the light-emitting module 100. The light extraction efficiency from the upper surface 11 of the light guide plate 10 can be increased thereby.

The first light-reflective member 41 faces the lower surface 12 of the light guide plate 10 and the lower surface of the light source 20; and the second light-reflective member 42 faces the entire lower surface of the first light-reflective member 41. In other words, the first light-reflective member 41 and the second light-reflective member 42 are located also at the bottom surface of the through-hole 13 in which the light source 20 is located. The optical absorption of the regions under and at the vicinity of the light source 20 can be reduced thereby.

A method for manufacturing the planar light source 300 will now be described with reference to FIGS. 5 to 13.

Figure 5:
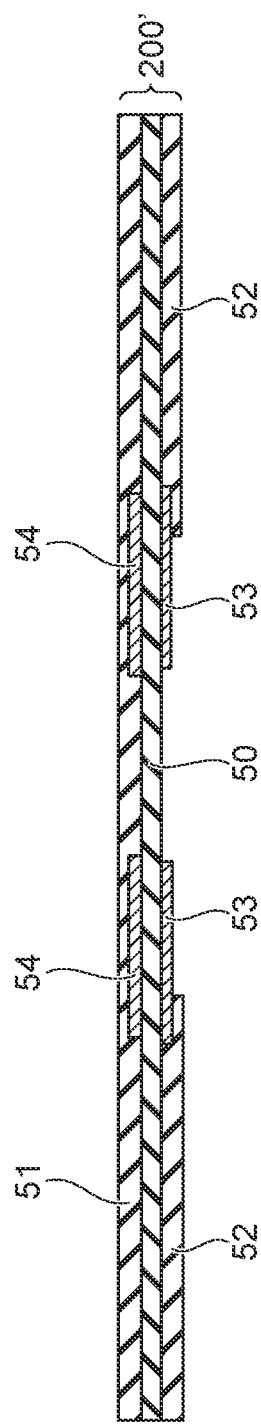
FIG. 5 to FIG. 13 are schematic cross-sectional views showing a method for manufacturing the planar light source of one embodiment of the invention.

The method for manufacturing the planar light source 300 according to the embodiment includes a process of preparing a structure body 200' shown in FIG. 5. The structure body 200' is the structure body of the wiring substrate 200 described above before forming the conductive member 60.

Figure 6:
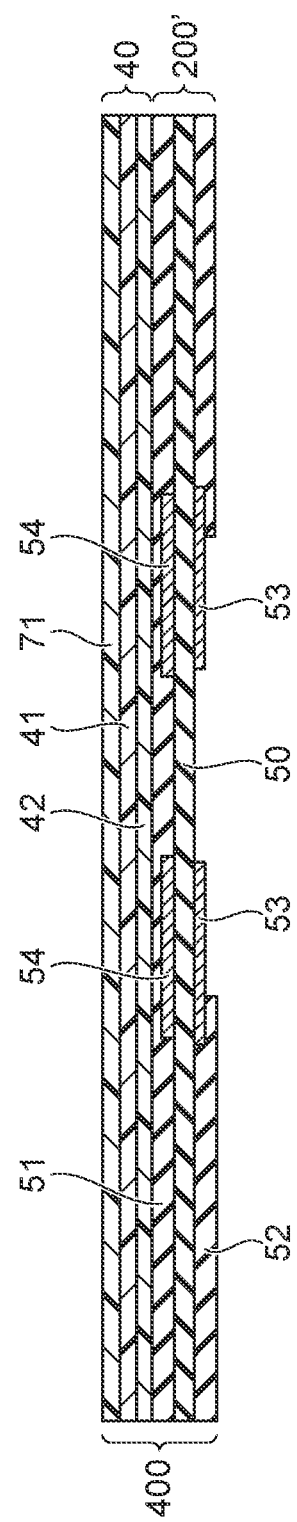

As shown in FIG. 6, a structure body 400 is formed by disposing a stacked sheet 40 on the structure body 200'. The stacked sheet 40 includes the second light-reflective member 42 that is located on the second insulating layer 51 of the structure body 200', the first light-reflective member 41 that is located on the second light-reflective member 42, and the bonding member 71 that is located on the first light-reflective member 41.

Figure 7:
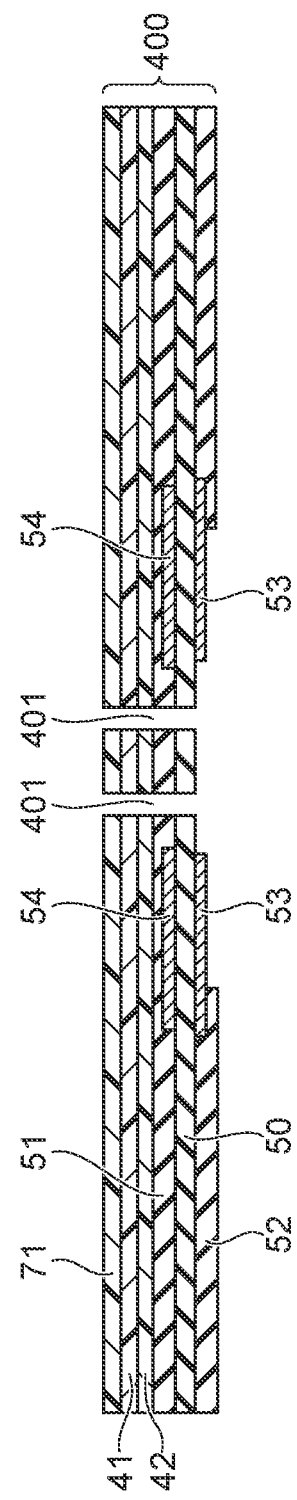

As shown in FIG. 7, the hole 401 is formed in the structure body 400. The hole 401 extends through the bonding member 71, the first light-reflective member 41, the second light-reflective member 42, the second insulating layer 51, and the insulating base 50. For example, the hole 401 may formed with a drill, or by punching or laser patterning. Alternatively, the hole 401 may be formed to continuously extend through the bonding member 71, the first light-reflective member 41, the second light-reflective member 42, the second insulating layer 51, and the insulating base 50 by procuring the bonding member 71, the first light-reflective member 41, the second light-reflective member 42, the second insulating layer 51, and the insulating base 50 (the first insulating layer 52, the first wiring layer 53, and the second wiring layer 54 being bonded to each other in the insulating base 50) in which holes are formed and by bonding these components. Alternatively, the structure body 400 may be prepared by procuring the structure body 400 in which the hole 401 is preformed.

Figure 8:
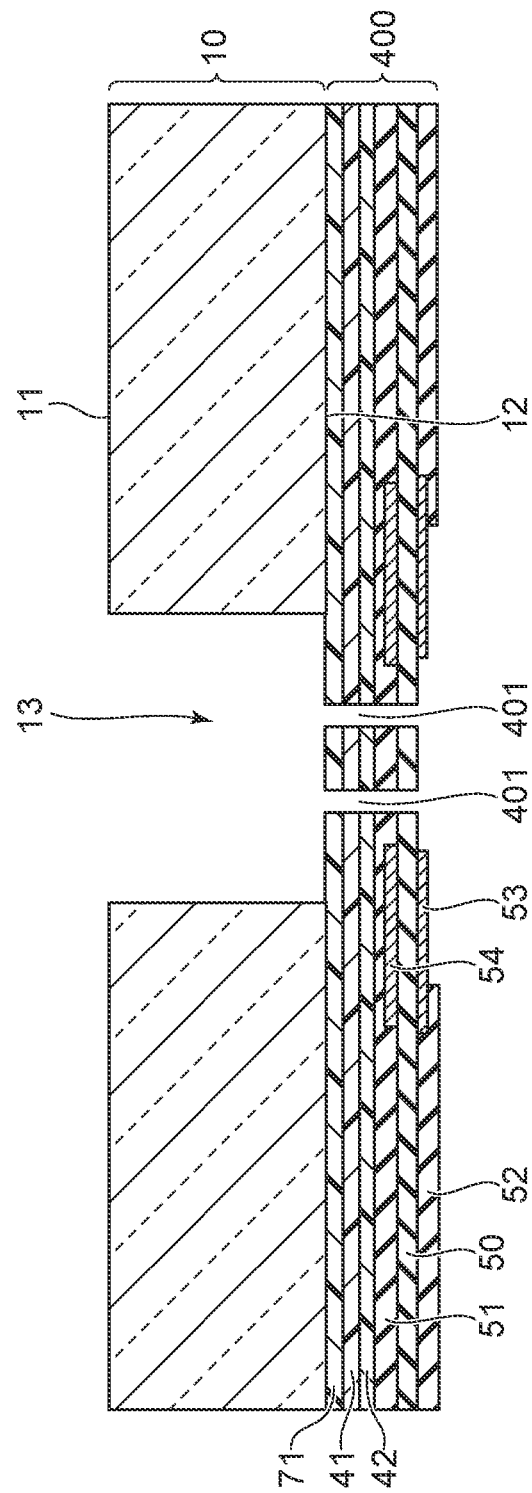

As shown in FIG. 8, the light guide plate 10 is located on the structure body 400 in which the hole 401 is formed. The lower surface 12 of the light guide plate 10 is bonded to the bonding member 71. The through-hole 13 is formed in the light guide plate 10; and the through-hole 13 is positioned to overlap the hole 401.

Figure 9:
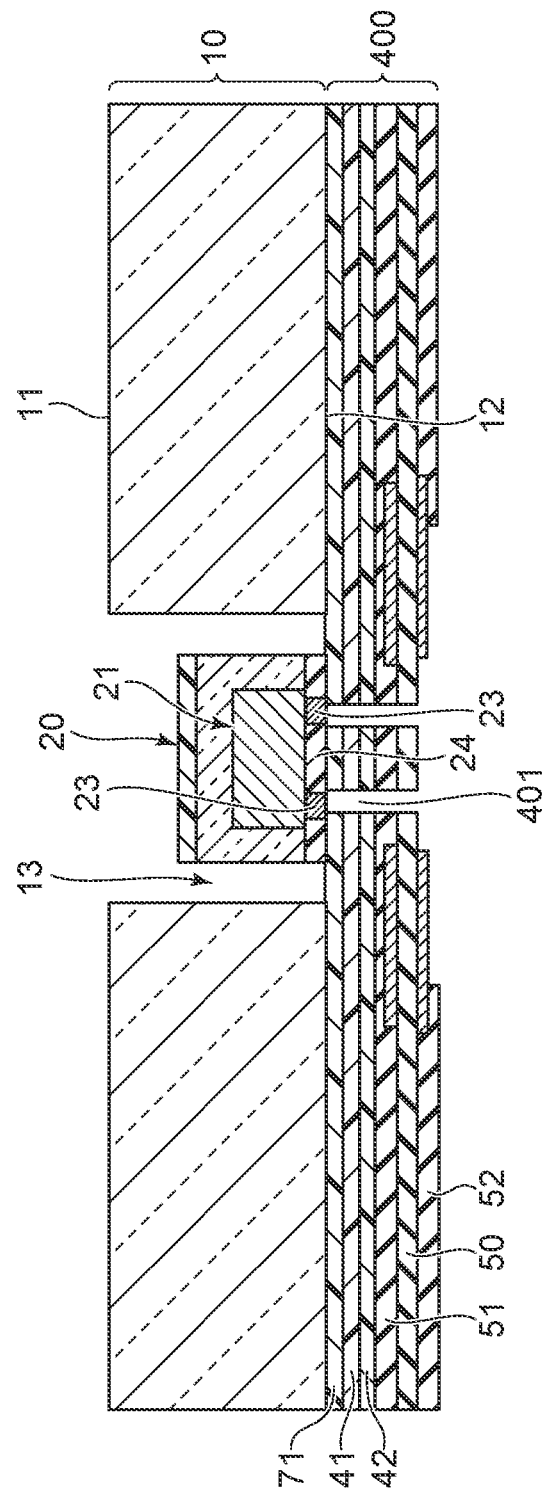

As shown in FIG. 9, the light source 20 is disposed in the through-hole 13. The lower surface of the cover member 24 that is the lower surface of the light source 20 is bonded to the upper surface of the first light-reflective member 41 that is exposed in the through-hole 13. The electrode 23 of the light source 20 is aligned with the hole 401. At least a portion of the lower surface of the electrode 23 is exposed in the hole 401.

Figure 10:
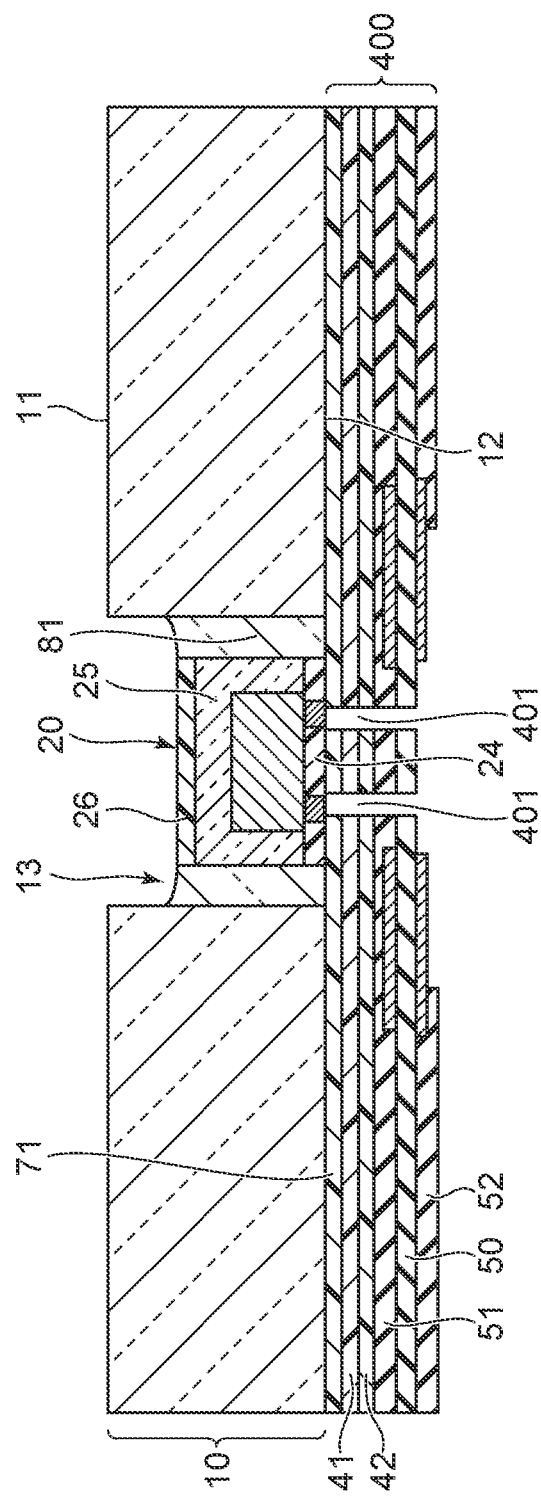

After the light source 20 is disposed, a light-transmitting member 81 is formed in the through-hole 13 as shown in FIG. 10. The light-transmitting member 81 is formed between the side surface of the light source 20 and the inner side surface of the through-hole 13. For example, the light-transmitting member 81 is formed by supplying a liquid light-transmitting resin to the through-hole 13 and by subsequently curing. It is favorable for the heating temperature when curing the light-transmitting resin to be not less than 30° C. and not more than 150° C., and more favorably not less than 40° C. and not more than 130° C. The side surface of the light source 20 is covered with the light-transmitting member 81; and the upper surface of the light source 20 is not covered with the light-transmitting member 81 in the through-hole 13.

Figure 11:
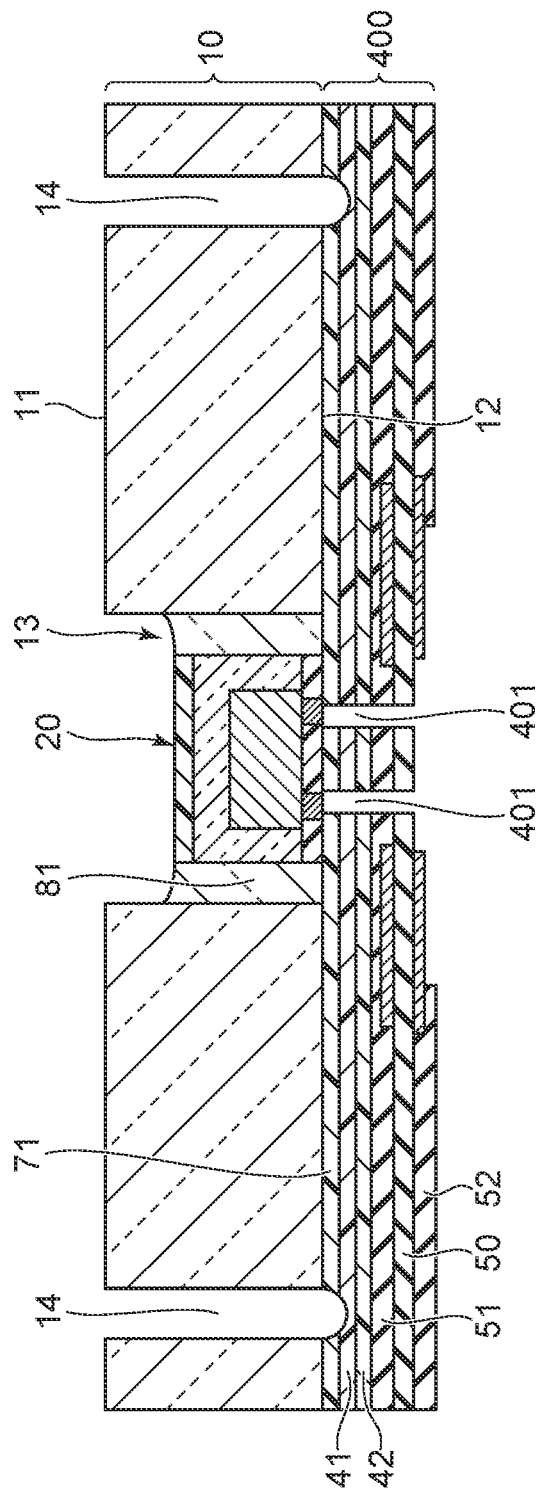

After the light-transmitting member 81 is formed in the through-hole 13, the partitioning groove 14 is formed in the light guide plate 10 as shown in FIG. 11. In the example shown in FIG. 11, the partitioning groove 14 extends through the light guide plate 10 and reaches a portion of the structure body 400. For example, the partitioning groove 14 is formed by cutting. The gap between the side surface of the light source 20 and the inner side surface of the through-hole 13 is filled with the light-transmitting member 81; therefore, cutting chips of the partitioning groove 14 can be prevented from entering the gap.

Figure 12:
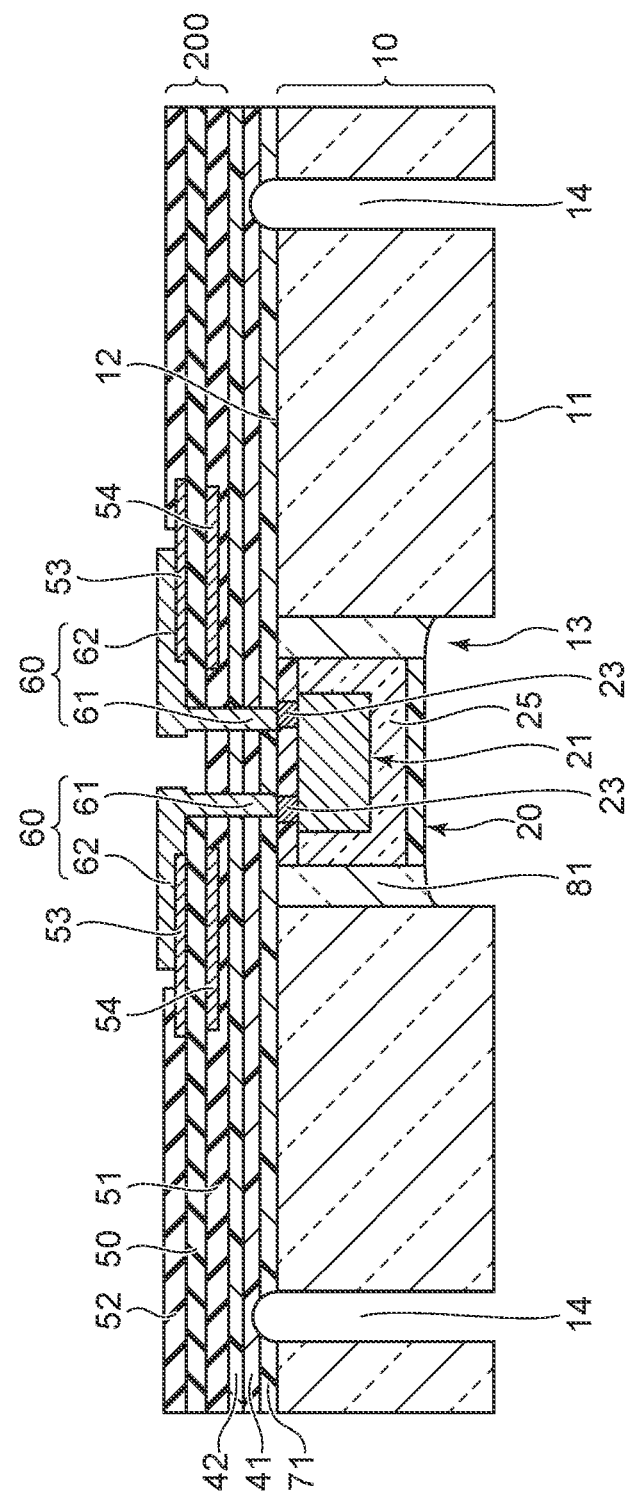

After the partitioning groove 14 is formed, the first conductive portion 61 is formed in the hole 401. As shown in FIG. 12, for example, a conductive paste is supplied to the hole 401 in a state in which the structure body 400 is positioned higher than the light guide plate 10 and the light source 20. The first conductive portion 61 that is connected with the electrode 23 of the light source 20 is formed by curing the conductive paste. The second conductive portion 62 is formed on the surface of the insulating base 50 at which the first wiring layer 53 is formed to be connected to the first wiring layer 53 and the first conductive portion 61. For example, the second conductive portion 62 is formed by supplying a conductive paste onto the surface of the insulating base 50 by subsequently curing. For example, the first conductive portion 61 and the second conductive portion 62 are formed to have a continuous body in the same process. In such a case, the light source 20 is already bonded to the bonding member 71; therefore, the conductive paste does not enter between the bonding member 71 and the lower surface of the light source 20. Short-circuits between the electrodes 23 via the conductive paste can be prevented thereby.

Figure 13:
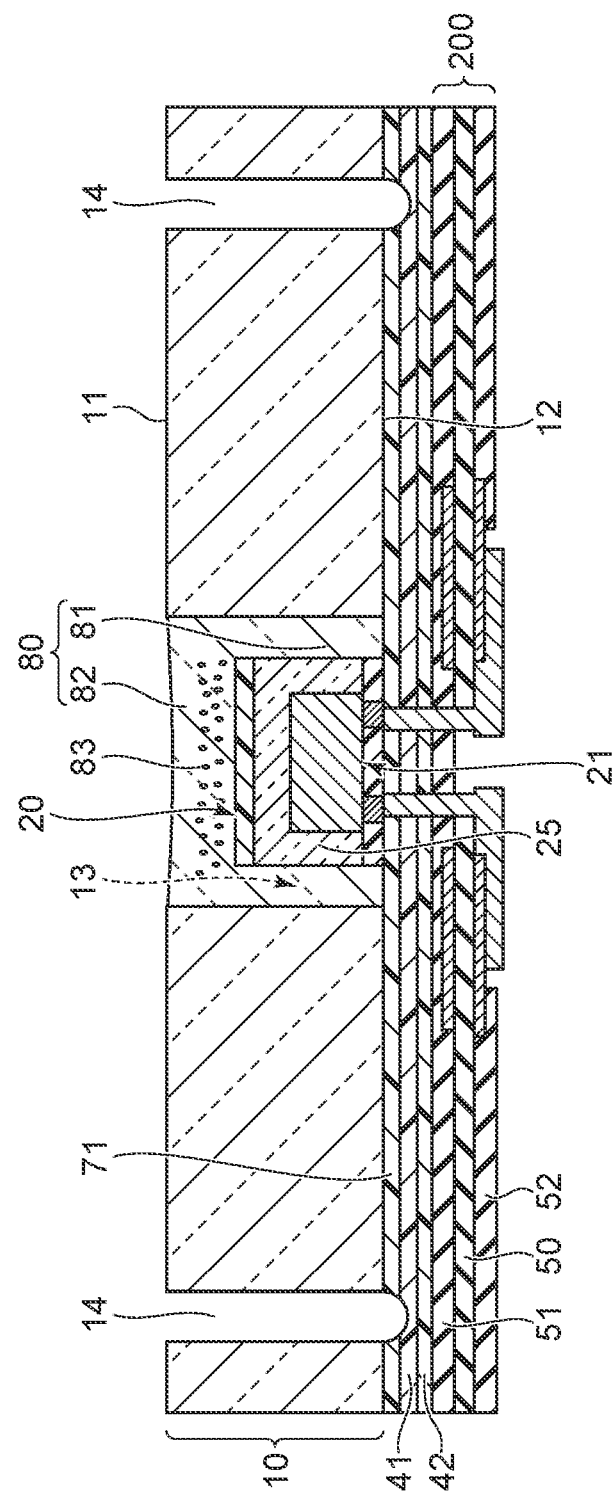

After the conductive member 60 is formed, a light-transmitting member 82 shown in FIG. 13 is formed on the light-transmitting member 81 and on the light source 20 in the through-hole 13. Thereby, the through-hole 13 is filled with the first light-transmitting member 80 that is made of the light-transmitting members 81 and 82.

For example, the light-transmitting member 82 is formed by supplying a liquid light-transmitting resin to the through-hole 13 and by subsequently curing. In such a case, color tone correction is possible by dispersing a phosphor 83 inside the light-transmitting resin.

For example, the light-emitting element 21 is caused to emit light by supplying a current to the light-emitting element 21 via the conductive member 60 in the state of FIG. 12. The phosphor that is included in the second light-transmitting member 25 is excited by the light emitted by the light-emitting element 21 and emits light. In other words, the color of the light emitted by the light source 20 is a mixed color of the color of the light emitted by the light-emitting element 21 and the color of the light emitted by the phosphor, and the chromaticity of the light of the light source 20 is measured. The chromaticity can be corrected to the target chromaticity by mixing an appropriate amount of the phosphor 83 into the light-transmitting member 82 according to the measurement result of the chromaticity. The phosphor for chromaticity correction may be mixed into the light-transmitting member 81 when forming the light-transmitting member 81 in the through-hole 13 in the process shown in FIG. 10.

After the through-hole 13 is filled with the first light-transmitting member 80, the third light-reflective member 43 is formed in the partitioning groove 14 as shown in FIG. 2. The first light-modulating member 90 is formed on the first light-transmitting member 80. The third light-reflective member 43 and the first light-modulating member 90 can be simultaneously formed from the same material. For example, the third light-reflective member 43 and the first light-modulating member 90 can be formed by printing or inkjet.

Figure 4B:
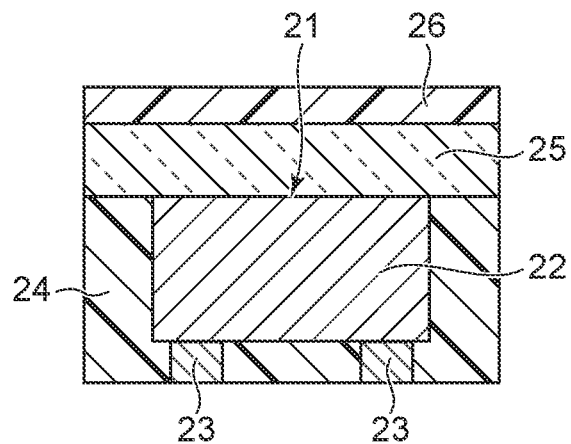
FIG. 4B is a schematic cross-sectional view of a light source of another embodiment of the invention.

FIG. 4B is a schematic cross-sectional view of another example of the light source.

The cover member 24 covers the side surface and lower surface of the semiconductor stacked body 22 of the light-emitting element 21. The second light-transmitting member 25 is located on the upper surface of the semiconductor stacked body 22. The second light-transmitting member 25 is located also on the cover member 24 that covers the side surface of the semiconductor stacked body 22. The second light-modulating member 26 is located on the second light-transmitting member 25. According to the desired light distribution, the second light-modulating member 26 is not necessarily provided on the second light-transmitting member 25.

Figure 4C:
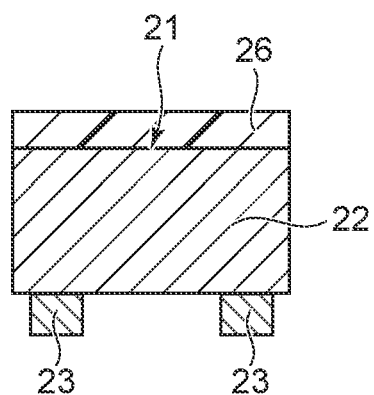
FIG. 4C is a schematic cross-sectional view of a light source of another embodiment of the invention.

FIG. 4C is a schematic cross-sectional view of another example of the light source.

The light source shown in FIG. 4C includes the light-emitting element 21 and the second light-modulating member 26 that is located at the upper surface of the light-emitting element 21, but does not include the second light-transmitting member 25 and the cover member 24 described above. According to the desired light distribution, the second light-modulating member 26 is not necessarily provided at the upper surface of the light-emitting element 21.

Figure 14:
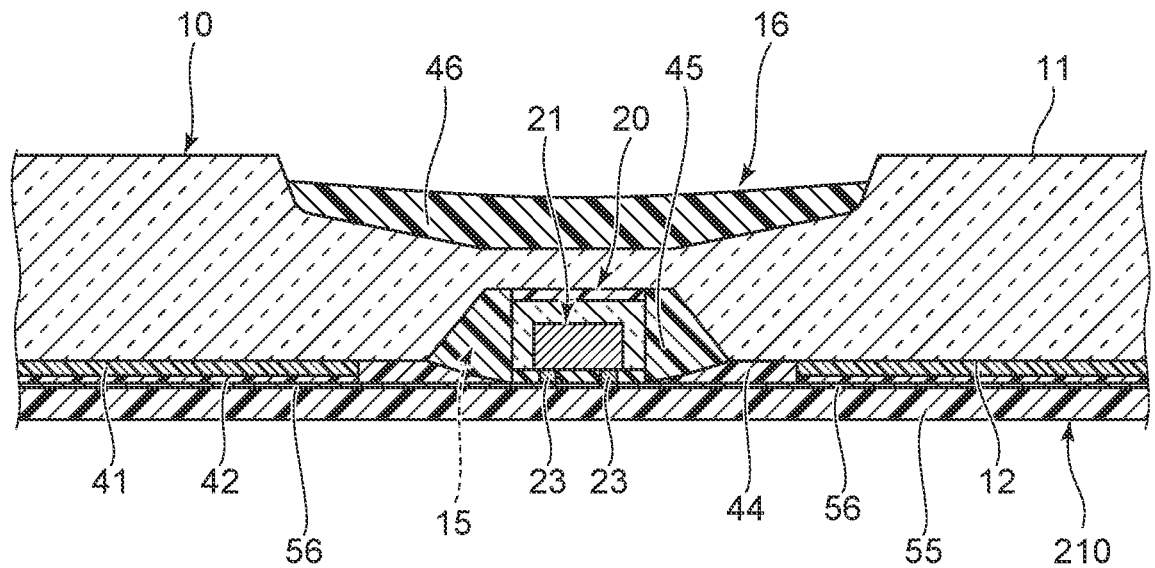
FIG. 14 is a schematic cross-sectional view of one portion of a planar light source according to another embodiment of the invention.

FIG. 14 is a schematic cross-sectional view of one portion of a planar light source according to another embodiment of the invention. FIG. 14 illustrates a cross section including a portion of the planar light source where the light source 20 is located and a peripheral portion of the planar light source.

The light guide plate 10 includes a bottomed hole portion 15 having a concave cross-section that is open at the lower surface 12 side. According to the embodiment, the hole portion 15 is a truncated-circular-conical space and can also be, for example, a truncated-polygonal-pyramid space that has a truncated rectangular pyramid shape, a truncated hexagonal pyramid shape, etc. The light source 20 is located in such a hole portion 15. A light-reflective member 45 is located between the inner side surface of the hole portion 15 and the side surface of the light source 20. The light-reflective member 45 is, for example, a resin member that includes a light-diffusing agent.

A recess 16 is formed in the upper surface 11 side of the light guide plate 10 at a position facing the hole portion 15. For example, a recess that has a polygonal pyramid shape such as a circular cone, a rectangular pyramid, a hexagonal pyramid, or the like, a recess that has a truncated polygonal pyramid shape such as a truncated circular cone, a truncated rectangular pyramid, a truncated hexagonal pyramid, etc., are examples of the recess 16. Also, a first light-modulating member 46 is located in the recess 16. The first light-modulating member 46 has a configuration similar to that of the first light-modulating member 90 described above.

Similarly to embodiments described above, the first light-reflective member 41 is located at the lower surface 12 side of the light guide plate 10, and the second light-reflective member 42 is located at the lower surface side of the first light-reflective member 41.

A light-reflective member 44 is located at the peripheral region of the light source 20 of the lower surface 12 of the light guide plate 10 and at the lower surface of the light-reflective member 45. The light-reflective member 44 is, for example, a resin member that includes a light-diffusing agent.

The electrode 23 of the light source 20 is connected to a wiring layer 56 of a wiring substrate 210. The wiring substrate 210 includes an insulating base 55, and the wiring layer 56 that is formed on the insulating base 55. The first light-reflective member 41 and the second light-reflective member 42 are located between the wiring substrate 210 and the lower surface 12 of the light guide plate 10.

In the planar light source shown in FIG. 14 as well, by combining the first light-reflective member 41 and the second light-reflective member 42 that have different reflective characteristics, the light that escapes downward from the light guide plate 10 can be suppressed while ensuring the light-guiding ability inside the light guide plate 10; and the light extraction efficiency from the upper surface 11 can be increased.

Figure 15:
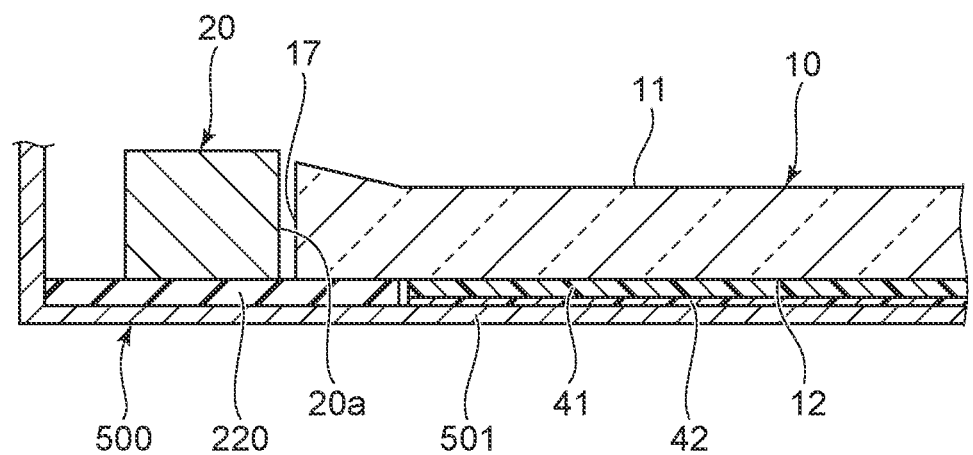
FIG. 15 is a schematic cross-sectional view of one portion of a planar light source according to another embodiment of the invention.

FIG. 15 is a schematic cross-sectional view of one portion of a planar light source according to another embodiment of the invention.

The planar light source is an edge-type planar light source; and the light source 20 faces an end surface 17 of the light guide plate 10. The end surface 17 of the light guide plate 10 is a light incident surface on which the light from the light source 20 is incident, and a light-emitting surface 20a of the light source 20 faces the end surface 17 of the light guide plate 10.

The light source 20 and the light guide plate 10 are located in a case 500. A wiring substrate 220 is located between the light source 20 and a bottom wall 501 of the case 500; and the light source 20 is mounted on the wiring substrate 220.

The lower surface 12 of the light guide plate 10 faces the bottom wall 501 of the case 500, and the first light-reflective member 41 and the second light-reflective member 42 described above are located between the lower surface 12 of the light guide plate 10 and the bottom wall 501 of the case 500. The first light-reflective member 41 is located at the lower surface 12 side of the light guide plate 10, and the second light-reflective member 42 is located at the lower surface side of the first light-reflective member 41.

In the planar light source shown in FIG. 15 as well, by combining the first light-reflective member 41 and the second light-reflective member 42 that have different reflective characteristics, it is possible to suppress the escape of light downward from the light guide plate 10 while ensuring the light-guiding ability inside the light guide plate 10, and to increase the light extraction efficiency from the upper surface 11.

In the embodiments described above, the second light-reflective member 42 that has a higher reflectance than the first light-reflective member 41 can be located at the lower surface side of the first light-reflective member 41; for example, a metal film, a dielectric multilayer film, etc., can be used as the second light-reflective member 42.

Also, an air layer can be used as a light guide member that corresponds to the light guide plate 10.

In the method for manufacturing the planar light source 300 described above, after forming the first conductive portion 61 in the hole 401 of the structure body 400 shown in FIG. 7, the light guide plate 10 may be disposed on the structure body 400, and the light source 20 may be disposed in the through-hole 13 of the light guide plate 10. Thereafter, the process of forming the light-transmitting member 81 in the through-hole 13, the process of forming the partitioning groove 14 in the light guide plate 10, the process of forming the second conductive portion 62, etc., are continued.

In the method for manufacturing the planar light source 300 described above, the first light-transmitting member 80 may be disposed in the through-hole 13 to cover the light source 20 after forming the first conductive portion 61 in the hole 401 of the structure body 400 shown in FIG. 9. In such a case, for example, the process of forming the partitioning groove 14 in the light guide plate 10 can be performed after disposing the light guide plate on the structure body 400 shown in FIG. 8 and before disposing the light source 20 in the through-hole 13 of the light guide plate 10 shown in FIG. 9. The first light-transmitting member 80 may include the multiple light-transmitting members 81 and 82 or may include a single-layer light-transmitting member. The single-layer light-transmitting member can include, for example, the phosphor, the light-diffusing agent, etc., described above.

Embodiments of the present invention have been described with reference to specific examples. However, the present invention is not limited to these specific examples. Based on the above-described embodiments of the present invention, all embodiments that can be implemented with appropriately design modification by one skilled in the art are also within the scope of the present invention as long as the gist of the present invention is included. Further, one skilled in the art can conceive various modifications that fall within the scope of the present invention.

What is claimed is:

1. A light-emitting module comprising:
a light source;
a light guide plate including an upper surface and a lower surface, the lower surface being at a side opposite to the upper surface, the light guide plate being configured to guide light from the light source;
a wavelength conversion sheet located at an upper surface side of the light guide plate;
a first light-reflective member located at a lower surface side of the light guide plate, wherein the first light-reflective member comprises:
a first resin member, and
a first reflector,
wherein a refractive index of the first reflector is lower than a refractive index of the first resin member; and
a second light-reflective member located at a lower surface side of the first light-reflective member, wherein the second light-reflective member comprises:
a second resin member, and
a second reflector,
wherein a refractive index of the second reflector is higher than a refractive index of the second resin member.

2. The module according to claim 1, wherein:
the wavelength conversion sheet includes a red phosphor and a green phosphor.

3. The module according to claim 1, wherein:
the wavelength conversion sheet includes a first wavelength conversion sheet including a red phosphor, and a second wavelength conversion sheet including a green phosphor.

4. The module according to claim 2, wherein:
the red phosphor is a fluoride-based phosphor or a quantum dot phosphor.

5. The module according to claim 3, wherein:
the red phosphor is a fluoride-based phosphor or a quantum dot phosphor.

6. The module according to claim 2, wherein:
the green phosphor is a phosphor having a perovskite structure or a quantum dot phosphor.

7. The module according to claim 3, wherein:
the green phosphor is a phosphor having a perovskite structure or a quantum dot phosphor.

8. The module according to claim 1, wherein:
the first reflector is a bubble.

9. The module according to claim 1, wherein:
the second reflector is a titanium oxide particle.

10. The module according to claim 1, wherein:
the refractive index of the second resin is lower than the refractive index of the first resin member.

11. The module according to claim 1, wherein:
the first resin member is formed of a polyethylene terephthalate resin, an olefin resin, an acrylic resin, a silicone resin, a urethane resin, or an epoxy resin.

12. The module according to claim 1, wherein:
the second resin member is formed of an acrylic resin, a silicone resin, a urethane resin, or an epoxy resin.

13. The module according to claim 1, wherein:
a thickness of the second light-reflective member is less than a thickness of the first light-reflective member.

14. The module according to claim 1, wherein:
the first light-reflective member faces the lower surface of the light guide plate and a lower surface of the light source.

15. The module according to claim 14, wherein:
the second light-reflective member faces an entire lower surface of the first light-reflective member.

16. The module according to claim 1, wherein:
the light guide plate includes a hole portion, and
the light source is located in the hole portion.

17. The module according to claim 16, wherein:
the hole portion is a bottomed hole portion that is open at the lower surface side of the light guide plate.

18. The module according to claim 16, wherein:
the hole portion is a through-hole extending from the upper surface to the lower surface of the light guide plate.

19. A planar light source, comprising:
the light-emitting module according to claim 1; and
a wiring substrate;
wherein the first light-reflective member and the second light-reflective member are located between the wiring substrate and the lower surface of the light guide plate.

* * * * *